(12) United States Patent
Lee et al.

(10) Patent No.: US 12,707,827 B2
(45) Date of Patent: Aug. 11, 2026

(54) EMISSIVE DISPLAY DEVICE AND MANUFACTURING METHOD THEREOF

(71) Applicant: Samsung Display Co., LTD., Yongin-si (KR)

(72) Inventors: Pil Suk Lee, Yongin-si (KR); Yoo Min Ko, Yongin-si (KR); Sun Ho Kim, Yongin-si (KR); Hye Won Kim, Yongin-si (KR); Ju Chan Park, Yongin-si (KR); Chung Sock Choi, Yongin-si (KR); Sung Jin Hong, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 483 days.

(21) Appl. No.: 18/332,887

(22) Filed: Jun. 12, 2023

(65) Prior Publication Data

US 2023/0403888 A1 Dec. 14, 2023

(30) Foreign Application Priority Data

Jun. 13, 2022 (KR) ........................ 10-2022-0071736

(51) Int. Cl.

| | |
|---|---|
| ***H10K 59/123*** | (2023.01) |
| ***H10K 59/12*** | (2023.01) |
| ***H10K 59/122*** | (2023.01) |
| ***H10K 59/131*** | (2023.01) |

(52) U.S. Cl.

CPC ....... *H10K 59/123* (2023.02); *H10K 59/1201* (2023.02); *H10K 59/122* (2023.02); *H10K 59/131* (2023.02)

(58) Field of Classification Search

CPC .. H10K 59/123; H10K 59/122; H10K 59/124; H10K 59/131

See application file for complete search history.

(56) References Cited

U.S. PATENT DOCUMENTS

| | | | | |
|---|---|---|---|---|
| 8,648,337 | B2 | 2/2014 | Hsieh | |
| 2005/0242350 | A1 * | 11/2005 | Bae | H10K 59/8052 257/59 |
| 2005/0285511 | A1 * | 12/2005 | Bae | H10K 59/1275 445/24 |
| 2006/0082284 | A1 * | 4/2006 | Shibusawa | H10D 86/00 313/500 |

FOREIGN PATENT DOCUMENTS

| | | |
|---|---|---|
| KR | 10-1040816 | 6/2011 |
| KR | 10-2015-0075016 | 7/2015 |
| KR | 10-2248402 | 5/2021 |

* cited by examiner

*Primary Examiner* — Douglas M Menz

(74) *Attorney, Agent, or Firm* — Innovation Counsel LLP

(57) ABSTRACT

An emissive display device includes: a substrate; a transistor disposed on the substrate; an insulating layer disposed on the transistor; a connection electrode disposed on the insulating layer and electrically connected to the transistor; a first electrode of a light emitting element disposed on the insulating layer; a separation pattern layer including a first pattern layer disposed on the connection electrode and a second pattern layer disposed on the insulating layer; a pixel defining layer disposed on the insulating layer and the separation pattern layer and including an opening overlapping the connection electrode; and a second electrode of the light emitting element disposed on the pixel defining layer and connected to the connection electrode through the opening of the pixel defining layer.

16 Claims, 13 Drawing Sheets

EMISSIVE DISPLAY DEVICE AND MANUFACTURING METHOD THEREOF

CROSS-REFERENCE TO RELATED APPLICATION(S)

This application claims priority to and benefits of Korean Patent Application No. 10-2022-0071736 under 35 U.S.C. § 119, filed on Jun. 13, 2022, in the Korean Intellectual Property Office, the entire contents of which are incorporated herein by reference.

BACKGROUND

1. Technical Field

Embodiments relate to a display device including light emitting elements and a manufacturing method of the display device.

2. Description of the Related Art

An emissive display device may include light emitting elements of pixels, and may display an image by controlling brightness of each of the light emitting elements. Unlike a light-receiving type of display device such as a liquid crystal display, the emissive display device may not require a separate light source such that the thickness and the weight of the emissive display device may be reduced. Further, the emissive display device has characteristics such as high luminance, a high contrast ratio, high color reproduction, a high response speed, and the like, to display a high quality image.

Thus, the emissive display device is applied to various electronic devices including mobile devices such as smart phones, tablets, and laptop computers, monitors, televisions, and the like, and has been in the spotlight as a display device for vehicles.

SUMMARY

A pixel of an emissive display device may include a light emitting element and a pixel circuit unit connected to the light emitting element. The pixel circuit unit may include an n-type (or NMOS) transistor and/or a p-type (or PMOS) transistor. In case that the pixel circuit unit is formed of an n-type transistor, as a source voltage of a driving transistor is shifted due to deterioration of the light emitting element, an afterimage or luminance deterioration may be accelerated, thereby deteriorating display quality.

Embodiments provide an emissive display device and a manufacturing method of the emissive display device, capable of improving display quality.

However, embodiments of the disclosure are not limited to those set forth herein. The above and other embodiments will become more apparent to one of ordinary skill in the art to which the disclosure pertains by referencing the detailed description of the disclosure given below.

An emissive display device according to an embodiment may include: a substrate; a transistor disposed on the substrate; an insulating layer disposed on the transistor; a connection electrode disposed on the insulating layer and electrically connected to the transistor; a first electrode of a light emitting element disposed on the insulating layer; a separation pattern layer including a first pattern layer disposed on the connection electrode and a second pattern layer disposed on the insulating layer; a pixel defining layer disposed on the insulating layer and the separation pattern layer and including an opening overlapping the connection electrode; and a second electrode of the light emitting element disposed on the pixel defining layer and connected to the connection electrode through the opening of the pixel defining layer.

The pixel defining layer may include a protrusion portion protruding laterally from the separation pattern layer and may define a portion of the opening of the pixel defining layer.

The protrusion portion may be spaced apart from the insulating layer by at least a thickness of the separation pattern layer.

A first portion of the second electrode disposed in the opening of the pixel defining layer and a second portion disposed on the protrusion portion may be separated from each other.

The emissive display device may further include a functional layer disposed between the first electrode and the second electrode. The second electrode may be in contact with the connection electrode and may cover an edge portion of the functional layer in the opening of the pixel defining layer.

The second electrode includes a plurality of second electrodes in a plurality of pixels, and the plurality of second electrodes may be separated from each other.

The separation pattern layer may include an oxide semiconductor.

The first electrode may be an anode of the light emitting element, and the second electrode may be a cathode of the light emitting element.

A high potential power voltage may be applied to the first electrode.

The connection electrode and the first electrode may be formed of a same material in a same process.

The transistor may be an n-type transistor, and the connection electrode may be electrically connected to a drain electrode of the transistor.

The emissive display device may further include an extension wire disposed between the transistor and the insulating layer and electrically connected to the transistor and the connection electrode.

The connection electrode may be connected to the extension wire through a contact hole formed in the insulating layer.

The connection electrode may not overlap the transistor.

The connection electrode may be disposed between emission areas of adjacent pixels.

Adjacent pixels may display a same color light.

A manufacturing method of an emissive display device according to an embodiment may include: forming a transistor on a substrate; forming an insulating layer on the transistor; forming a connection electrode electrically connected to the transistor and a first electrode of a light emitting element by forming a first conductive material layer on the insulating layer and by patterning the first conductive material layer; forming a second conductive material layer or another insulating layer on the insulating layer and patterning the second conductive material layer or the another insulating layer to form a separation pattern layer including a first pattern layer disposed on the connection electrode and a second pattern layer surrounding the light emitting element; forming a pixel defining layer having a first opening overlapping the first electrode, a second opening overlapping the connection electrode, and a third opening adjacent to the second pattern layer by coating an organic material layer on the insulating layer and by patterning the organic material layer; and removing a portion of the separation pattern layer by a wet etching process etching the separation pattern layer by using the pixel defining layer as a mask.

The pixel defining layer may include a protrusion portion protruding laterally from the separation pattern layer, and the protrusion portion may be formed by the wet etching process etching the separation pattern layer.

The manufacturing method may further include forming a second electrode in contact with the connection electrode in the second opening of the pixel defining layer. The second electrode may include a first portion disposed in the second opening of the pixel defining layer and a second portion disposed on the protrusion portion. The first portion and the second portion of the second electrode may be separated from each other.

The separation pattern layer may include an oxide semiconductor.

According to the embodiments, it is possible to provide an emissive display device and a manufacturing method thereof, capable of improving display quality. Further, according to the embodiments, there are other advantageous effects that are recognized throughout the specification.

DETAILED DESCRIPTION OF THE EMBODIMENTS

Figure 1:
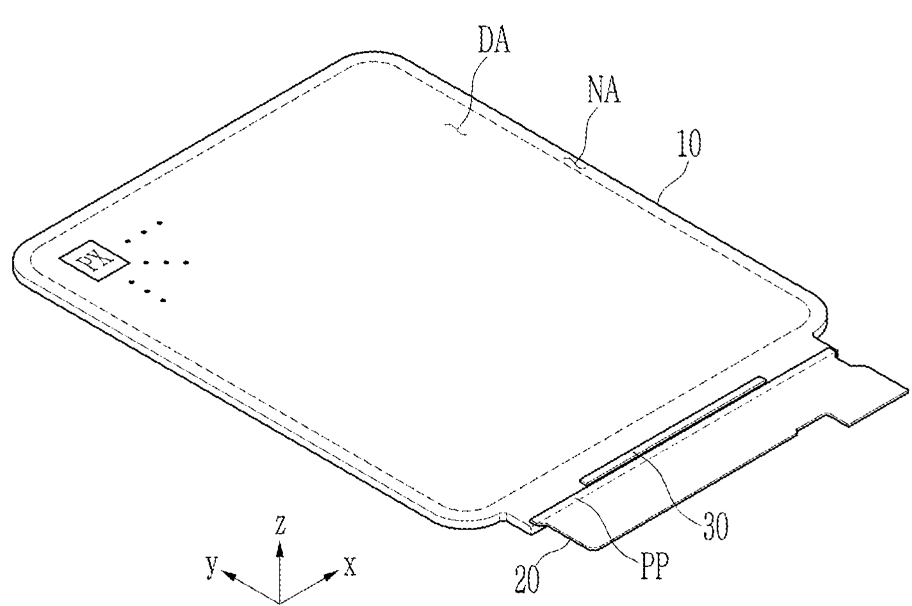
FIG. 1 illustrates a schematic perspective view showing an emissive display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

FIG. 1 illustrates a schematic perspective view showing an emissive display device according to an embodiment.

Referring to FIG. 1, an emissive display device (hereinafter referred to as a "display device") may display images in electronic devices such as mobile phones, smart phones, tablets, notebook computers, monitors, multimedia players, and game machines. The display device may include a display panel 10, a flexible printed circuit film 20 bonded to the display panel 10, a driving unit including an integrated circuit chip 30, etc.

The display panel 10 may include a display area DA corresponding to a screen on which an image is displayed and a non-display area NA. For example, circuits and/or signal lines for generating and/or transferring various signals and voltages applied to the display area DA may be disposed in the non-display area NA. The non-display area NA may be disposed to surround a periphery of the display area DA. In FIG. 1, the display area DA may be inside of a dotted rectangle, and the non-display area NA may be outside of the dotted rectangle.

Pixels PX may be disposed in a matrix form in the display area DA of the display panel 10. For example, signal lines such as a gate line and a driving voltage line may be disposed in the display area DA. The gate line may extend in a first direction x, and the data line and the driving voltage line may extend in a second direction y. A gate line, a data line, a driving voltage line, etc. may be connected to each pixel PX. Thus, each pixel PX may receive a gate signal (also referred to as a scan signal), a data voltage, a driving voltage, and the like from these signal lines. Each pixel PX may include a light emitting element and a pixel circuit unit connected to the light emitting element. The pixel circuit unit may generate a driving current based on signals applied through signal lines, such as a gate line and a data line, to apply the driving current to the light emitting element.

A touch sensor for detecting a touch and/or a non-contact touch of a user may be disposed in the display area DA. Although the display area DA having a substantially rectangular shape is illustrated, the display area DA may have various shapes such as a polygonal shape, a circular shape, an elliptical shape, and the like.

A pad portion PP including pads for receiving signals from the outside of the display panel 10 may be disposed in the non-display area NA of the display panel 10. The pad portion PP may extend in a first direction x along an edge portion of the display panel 10. The flexible printed circuit film 20 may be bonded to the pad portion PP, and pads of the flexible printed circuit film 20 may be connected (e.g., electrically connected) to pads of the pad portion PP.

A driving unit may be disposed in the non-display area NA of the display panel 10 to generate and/or process various signals for driving the display panel 10. The driving unit may include a data driver for applying a data voltage to the data line, a gate driver for applying a gate signal to the gate line, and a signal controller for controlling the data driver and the gate driver. The pixels PX may receive the data voltage at certain timing according to the gate signal generated by the gate driver. The gate driver may be integrated in the display panel 10, and may be disposed on at least one side of the display area DA. The data driver and the signal controller may be provided as an integrated circuit chip (also referred to as a driving IC chip or driving IC) 30, and the integrated circuit chip 30 may be mounted in the non-display area NA of the display panel 10. The integrated circuit chip 30 may be mounted on the flexible printed circuit film 20 or the like to be connected (e.g., electrically connected) to the display panel 10.

Figure 2:
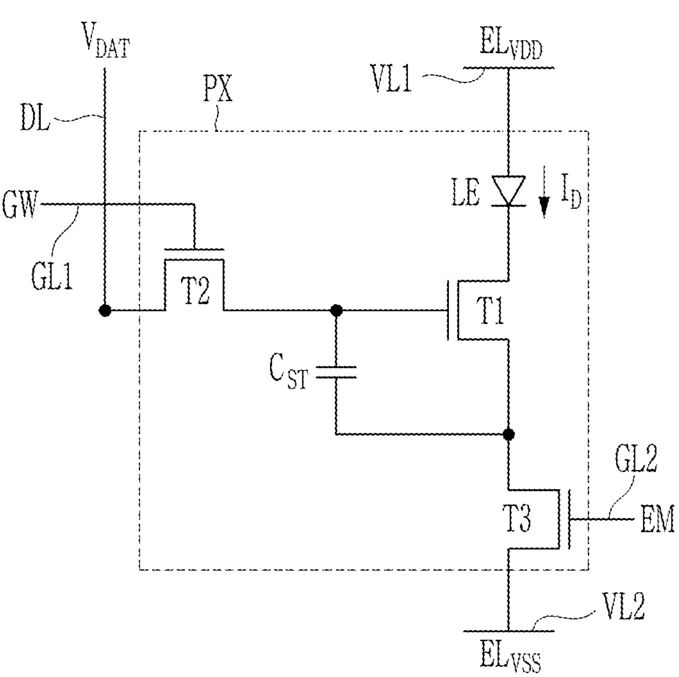
FIG. 2 illustrates a schematic diagram of an equivalent circuit of a pixel in an emissive display device according to an embodiment.
Figure 3:
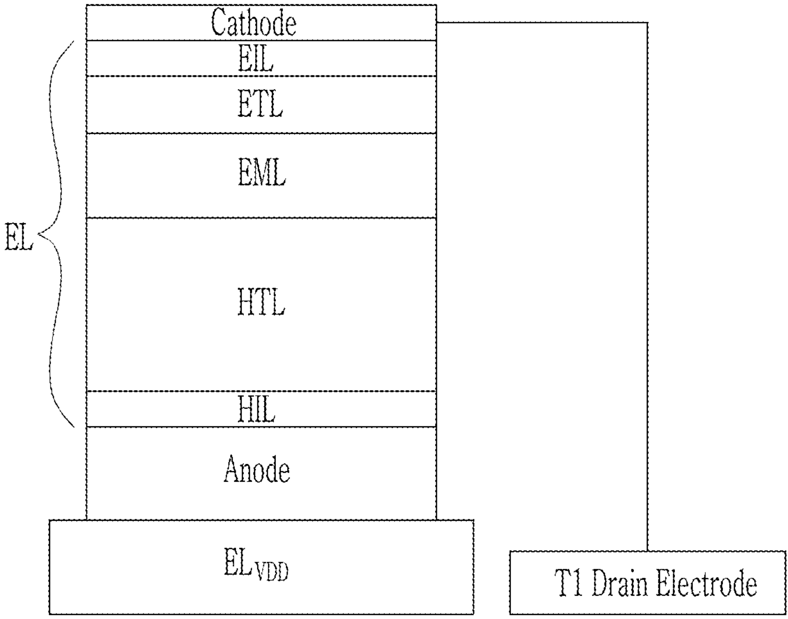
FIG. 3 illustrates a schematic view showing a stacked structure of light emitting elements in an emissive display device according to an embodiment.

FIG. 2 illustrates a schematic diagram of an equivalent circuit of a pixel in an emissive display device according to an embodiment, and FIG. 3 illustrates a schematic view showing a stacked structure of light emitting elements in an emissive display device according to an embodiment.

Referring to FIG. 2, each pixel PX may include a light emitting element LE and a pixel circuit unit connected to the light emitting element LE. The pixel circuit unit may include transistors T1, T2, and T3 and a storage capacitor $C_{ST}$. The light emitting element LE may be an organic light emitting diode or an inorganic light emitting diode, but embodiments are not limited thereto. Several signal lines GL1, GL2, DL, VL1, and VL2 may be connected to the pixel circuit unit. The pixel PX may have three transistors T1, T2, and T3 and one capacitor $C_{ST}$, but the number of transistors and the number of capacitors may be variously changed. Although a structure in which five signal lines GL1, GL2, DL, VL1, and VL2 are connected to the pixel PX is illustrated, a type and number of signal lines may be variously changed.

The signal lines GL1, GL2, DL, VL1, and VL2 may include a scan line GL1, an emission control line GL2, a data line DL, a first power voltage line VL1, and a second power voltage line VL2. The scan line GL1 and the emission control line GL2 may be connected (e.g., electrically connected) to a gate driver. The data line DL may be connected (e.g., electrically connected) to a data driver. The first power voltage line VL1 and the second power voltage line VL2 may be connected to a voltage generator. The scan line GL1 may transfer a scan signal GW to the second transistor T2. The emission control line GL2 may transfer an emission control signal EM to the third transistor T3. The data line DL may transfer the data voltage $V_{DAT}$. The first power voltage line VL1 (also referred to as a driving voltage line) may transfer a high potential power voltage $EL_{VDD}$ (also referred to as a first power voltage or driving voltage). The second power voltage line VL2 (also referred to as a common voltage line) may transfer a low potential power voltage $EL_{VSS}$ (also referred to as a second power voltage or a common voltage).

The transistors T1, T2, and T3 may include a first transistor T1 as a driving transistor, a second transistor T2 as a switching transistor, and a third transistor T3 as an emission control transistor. Each of the transistors T1, T2, and T3 may include a gate electrode, a first transistor electrode, and a second transistor electrode. One of the first transistor electrode and the second transistor electrode may be a source electrode and another may be a drain electrode according to a type and/or an operating condition of the transistors T1 to T3. The transistors T1, T2, and T3 may be n-type transistors, but at least one of the transistors T1, T2, and T3 may be a p-type transistor.

A gate electrode of the first transistor T1 may be connected to a first capacitor electrode of the storage capacitor $C_{ST}$ and a second transistor electrode of the second transistor T2, a first transistor electrode of the first transistor T1 may be connected to a second transistor electrode of the third transistor T3 and a second capacitor electrode of the storage capacitor $C_{ST}$, and a second transistor electrode of the first transistor T1 may be connected to a cathode of the light emitting element LE. The first transistor T1 may control a driving current ID flowing through the light emitting element LE according to a magnitude of a data voltage $V_{DAT}$ transferred through the second transistor T2, and the light emitting element LE may emit light with a luminance that varies according to a magnitude of the driving current ID. Accordingly, the pixel PX may display a gray by adjusting an amount of current flowing through the first transistor T1 according to a level of the data voltage $V_{DAT}$.

A gate electrode of the second transistor T2 may be connected to the scan line GL1, a first transistor electrode of the second transistor T2 may be connected to the data line DL, and the second transistor electrode of the second transistor T2 may be connected to the gate electrode of the first transistor T1 and the first capacitor electrode of the storage capacitor $C_{ST}$. The second transistor T2 may be turned on according to a scan signal GW transferred through the scan line GL1 to perform a switching operation of transferring the data voltage $V_{DAT}$ transferred through the data line DL to the gate electrode of the first transistor T1 and the first capacitor electrode of the storage capacitor $C_{ST}$.

A gate electrode of the third transistor T3 may be connected to the emission control line GL2, a first transistor electrode of the third transistor T3 may be connected to the second power voltage line VL2, and the second transistor electrode of the third transistor T3 may be connected to the first transistor electrode of the first transistor T1 and the second capacitor electrode of the storage capacitor $C_{ST}$. The third transistor T3 may be turned on according to the emission control signal EM transferred through the emission control line GL2 to control a current to flow through the first transistor T1. In case that the third transistor T3 is turned on, the driving current ID according to a magnitude of the data voltage $V_{DAT}$ charged in the storage capacitor $C_{ST}$ (or a voltage transferred to the storage capacitor $C_{ST}$) may be generated, the driving current ID may flow through the light emitting element LE, and the light emitting element LE may emit light.

The first capacitor electrode of the storage capacitor $C_{ST}$ may be connected to the gate electrode of the first transistor T1 and the second transistor electrode of the second transistor T2, and the second capacitor electrode of the storage capacitor $C_{ST}$ may be connected to the first transistor electrode of the first transistor T1 and the second transistor electrode of the third transistor T3. The storage capacitor $C_{ST}$ may apply (e.g., continuously apply) the charged data voltage $V_{DAT}$ to the first transistor T1 so as to emit (e.g., continuously emit) light from the light emitting element LE during an emission period.

An anode of the light emitting element LE may be connected to the first power voltage line VL1, and a cathode of the light emitting element LE may be connected to the second transistor electrode of the first transistor T1. The first transistor T1 may be an n-type transistor. The first power voltage line VL1 and the second power voltage line VL2 may apply the high potential power voltage $EL_{VDD}$ and the low potential power voltage $EL_{VSS}$, respectively. Thus the second transistor electrode of the first transistor T1 connected to the cathode of the light emitting element LE may be a drain electrode.

Referring to FIG. 3, the light emitting element LE may include an anode to which a high potential power voltage $EL_{VDD}$ is applied, a cathode connected to the drain electrode of the first transistor T1, and an intermediate layer EL disposed between the anode and the cathode. The intermediate layer EL may include an emission layer EML and a functional layer. The emission layer EML may be a layer in which electro-optical conversion occurs through a combination of electrons and holes. The emission layer EML may include an organic material and/or an inorganic material that emits light of a certain color. The functional layer may include at least one of a hole injection layer HIL, a hole transport layer HTL, an electron transport layer ETL, and an electron injection layer EIL. In FIG. 3, the functional layer may include a hole injection layer HIL and a hole transport layer HTL disposed between the anode and the emission layer EML and an electron transport layer ETL and an electron injection layer EIL disposed between the emission layer EML and the cathode.

The pixel circuit unit may include n-type transistors T1, T2, and T3. In case that the anode of the light emitting element LE is connected to the first transistor electrode (e.g., source electrode) of the first transistor T1, a gate-source voltage (Vgs) of the first transistor T1 may change as a source voltage of the first transistor T1 is shifted due to deterioration of the light emitting element LE. Therefore, a range of change of the driving current ID may be increased to be vulnerable to an afterimage and to accelerate a decrease in luminance. In an embodiment, in case that the light emitting element LE deteriorates, the gate-source voltage (Vgs) of the first transistor T1 may not be changed as a cathode of the light emitting element LE is connected to the second transistor electrode (e.g., drain electrode) of the first transistor T1. Accordingly, the range of change of the driving current ID may be reduced, thereby preventing or minimizing afterimages and reducing luminance.

In order to connect the cathode of the light emitting element LE to the second transistor electrode (e.g., drain electrode) of the first transistor T1, an inverted light emitting element may be formed by disposing a cathode thereof at a lower portion and by disposing an anode thereof at an upper portion.

However, the inverted light emitting element may have a disadvantage in driving voltage, luminous efficiency, and the like, compared to a non-inverted light emitting element. To solve such a problem, in an embodiment, the light emitting element LE, which includes the anode disposed at a lower portion and the cathode disposed at an upper portion, may be formed in a structure in which the cathode thereof is connected to the drain electrode of the first transistor T1.

Figure 4:
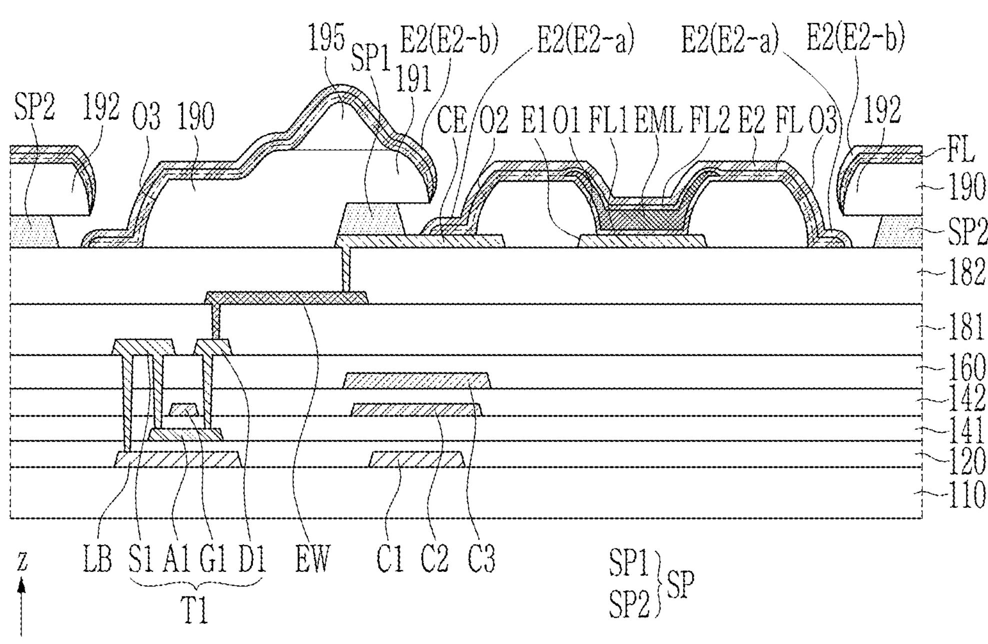
FIG. 4 illustrates a schematic cross-sectional view showing a display area in an emissive display panel according to an embodiment.

FIG. 4 illustrates a schematic cross-sectional view showing a display area in an emissive display panel according to an embodiment.

Referring to FIG. 4, a cross-section (e.g., stack structure) of an area corresponding to one pixel PX in the display area DA is illustrated. The display panel 10 may include a substrate 110 disposed over the display area DA and the non-display area NA. The substrate 110 may be a rigid substrate made of a material such as glass. The substrate 110 may be a flexible substrate including a polymer resin made of, e.g., a polyimide, a polyamide, and polyethylene terephthalate.

A first conductive layer including a light blocking layer LB and a first capacitor electrode C1 may be disposed on the substrate 110. The light blocking layer LB may prevent external light from reaching a semiconductor layer A1 to be described below, e.g., a channel region, thereby preventing deterioration of characteristics of the semiconductor layer A1 and controlling the leakage current of the first transistor T1. Components included in the first conductive layer may be formed of a same material in a same process. For example, the light blocking layer LB, the first capacitor electrode C1 and the like may be formed by depositing and patterning a conductive layer on the substrate 110. The first conductive layer may include molybdenum (Mo), aluminum (Al), copper (Cu), titanium (Ti), and the like, and may be a single layer or multiple layers.

A buffer layer 120 may be disposed on the first conductive layer. The buffer layer 120 may improve the characteristics of the semiconductor layer by blocking impurities from the substrate 110 in case that the semiconductor layer is formed, and may flatten a surface of the substrate 110 to relieve (or reduce) a stress of the semiconductor layer. The buffer layer 120 may be an inorganic insulating layer including an inorganic insulating material such as a silicon nitride ($SiN_x$), a silicon oxide ($SiO_x$), and a silicon oxynitride ($SiO_xN_y$), and may be a single layer or multiple layers.

A semiconductor layer A1 (also referred to as an active layer) may be disposed on the buffer layer 120. The semiconductor layer A1 may include a first region and a second region, and a channel region therebetween. The semiconductor layer A1 may include a semiconductor material such as an oxide semiconductor, amorphous silicon, or polysilicon. For example, the semiconductor layer may include an oxide semiconductor material including at least one of zinc (Zn), indium (In), gallium (Ga), or tin (Sn). For example, the semiconductor layer A1 may include an indium-gallium-zinc oxide (IGZO).

A first gate insulating layer 141 may be disposed on the semiconductor layer A1. The first gate insulating layer 141 may be an inorganic insulating layer including an inorganic insulating material such as a silicon nitride, a silicon oxide, and a silicon oxynitride, and may be a single layer or multiple layers.

A second conductive layer (or referred to as a first gate conductive layer) including a gate electrode G1, a second capacitor electrode C2, and the like may be disposed on the first gate insulating layer 141. Components included in the second conductive layer may be formed of a same material in a same process. For example, a conductive layer may be deposited on the first gate insulating layer 141 and patterned to form a gate electrode G1, a second capacitor electrode C2, and the like. The gate electrode G1 may overlap a channel region of the semiconductor layer A1. The second capacitor electrode C2 may overlap the first capacitor electrode C1. The first capacitor electrode C1 and the second capacitor electrode C2 may form the storage capacitor $C_{ST}$. The second capacitor electrode C2 and the gate electrode G1 may be different portions of one conductive pattern. The second capacitor electrode C2 and the gate electrode G1 may be connected (e.g., electrically connected). The second conductive layer may include molybdenum (Mo), aluminum (Al), copper (Cu), titanium (Ti), and the like, and may be a single layer or multiple layers.

A second gate insulating layer 142 may be disposed on the second conductive layer. The second gate insulating layer 142 may be an inorganic insulating layer including an inorganic insulating material such as a silicon nitride, a silicon oxide, and a silicon oxynitride, and may be a single layer or multiple layers.

A third conductive layer (or referred to as a second gate conductive layer) including a third capacitor electrode C3 and the like may be disposed on the second gate insulating layer 142. Components included in the third conductive layer may be formed of a same material in a same process. The third capacitor electrode C3 may overlap the second capacitor electrode C2. The second capacitor electrode C2 and the third capacitor electrode C3 may form a hold capacitor. The hold capacitor may stabilize a gate voltage of the first transistor T1 before a data voltage $V_{DAT}$ is applied. A low potential power voltage $EL_{VSS}$ may be applied to the third capacitor electrode C3, but embodiments are not limited thereto. The third conductive layer may include molybdenum (Mo), aluminum (Al), copper (Cu), titanium (Ti), and the like, and may be a single layer or multiple layers.

An interlayer insulating layer 160 may be disposed on the third conductive layer. The interlayer insulating layer 160 may be an inorganic insulating layer including an inorganic insulating material such as a silicon nitride, a silicon oxide, and a silicon oxynitride, and may be a single layer or multiple layers.

A fourth conductive layer (or referred to as a first data conductive layer) including a first transistor electrode S1, a second transistor electrode D1, and the like may be disposed on the interlayer insulating layer 160. Components included in the fourth conductive layer may be formed of a same material in a same process. The first transistor electrode S1 and the second transistor electrode D1 may be respectively connected to a first region and a second region of the semiconductor layer A1 through contact holes formed in the insulating layers 141, 142, and 160. The first transistor electrode S1 may be connected to the light blocking layer LB through contact holes formed in the buffer layer 120 and the insulating layers 141, 142, and 160. One of the first transistor electrode S1 and the second transistor electrode D1 may function as a source electrode, and the other may function as a drain electrode. The first transistor electrode S1, the second transistor electrode D1, the gate electrode G1, and the semiconductor layer A1 may form a first transistor T1. The first transistor T1 may be an n-type transistor, and the first transistor electrode S1 and the second transistor electrode D1 may be a source electrode and a drain electrode, respectively. For example, the second transistor T2 and the third transistor T3 may have substantially a same stacked structure as that of the first transistor T1. The fourth conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers.

A first planarization layer 181 may be disposed on the fourth conductive layer. The first planarization layer 181 may include an organic insulating material such as a general purpose polymer such as poly(methyl methacrylate) and polystyrene, a polymer derivative having a phenolic group, an acrylic polymer, an imide-based polymer (e.g., polyimide), and a siloxane-based polymer. The first planarization layer 181 may be referred to as a first organic insulating layer.

A fifth conductive layer (or referred to as a second data conductive layer) including an extension wire EW may be disposed on the first planarization layer 181. Components included in the fifth conductive layer may be formed of a same material in a same process. The extension wire EW may be connected to the second transistor electrode D1 of the first transistor T1 through a contact hole formed in the first planarization layer 181. The fifth conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers.

A second planarization layer 182 may be disposed on the fifth conductive layer. The second planarization layer 182 may include an organic insulating material such as a general purpose polymer such as poly(methyl methacrylate) or styrene, a polymer derivative having a phenolic group, an acrylic polymer, an imide-based polymer, and a siloxane-based polymer. The second planarization layer 182 may be referred to as a second organic insulating layer.

A sixth conductive layer (or referred to as a pixel conductive layer) including a first electrode E1 and a connection electrode CE may be disposed on the second planarization layer 182. Components included in the sixth conductive layer may be formed of a same material in a same process. The first electrode E1 may be an anode of the light emitting element LE. The high potential power voltage $EL_{VDD}$ may be applied to the first electrode E1. The first electrode E1 may be a portion of the first power voltage line VL1, or may be connected (e.g., electrically connected) to the first power voltage line VL1. The first power voltage line VL1 may be included in the sixth conductive layer, or may be included in the aforementioned conductive layer such as the fifth conductive layer and the fourth conductive layer. The connection electrode CE may be connected to the extension wire EW through a contact hole formed in the second planarization layer 182. Accordingly, the connection electrode CE may be connected (e.g., electrically connected) to the second transistor electrode D1 of the first transistor T1 through the extension wire EW. The connection electrode CE may not overlap the first transistor T1. In another example, the connection electrode CE may be connected to the second transistor electrode D1 of the first transistor T1 without passing through the extension wire EW. The sixth conductive layer may be formed of a reflective conductive material or a translucent conductive material, or may be formed of a transparent conductive material. The sixth conductive layer may include a transparent conductive material such as an indium tin oxide (ITO) or an indium zinc oxide (IZO). The sixth conductive layer may include a metal such as lithium (Li), calcium (Ca), aluminum (Al), silver (Ag), magnesium (Mg), or gold (Au), or a metal alloy thereof. The sixth conductive layer may have a multi-layered structure, and may have a triple-layer structure of, e.g., ITO/silver (Ag)/ITO.

For example, the aforementioned signal lines GL1, GL2, DL, VL1, and VL2 may be included in the first conductive layer, the second conductive layer, the third conductive layer, the fourth conductive layer, the fifth conductive layer, and/or the sixth conductive layer.

A separation pattern layer SP may be disposed on the second planarization layer 182. The separation pattern layer SP may include a first pattern layer SP1 disposed on the connection electrode CE and a second pattern layer SP2 surrounding the light emitting element LE. The separation pattern layer SP may be formed of a material that is etched by using the sixth conductive layer and an etchant having high selectivity. For example, the separation pattern layer may include an oxide semiconductor such as IGZO, zinc oxide (ZnO), indium oxide ($In_2O_3$), ITO, tungsten oxide ($WO_3$), or gallium oxide ($Ga_2O_3$). The separation pattern layer SP may have a conductor characteristic or a non-conductor characteristic according to an oxygen content of the oxide semiconductor.

A pixel defining layer 190 (also referred to as a bank) may be disposed on the second planarization layer 182 and the separation pattern layer SP. The pixel defining layer 190 may have a first opening O1 overlapping the first electrode E1. The first opening O1 of the pixel defining layer 190 may correspond to the emission area of the light emitting element. The pixel defining layer 190 may have a second opening O2 overlapping the connection electrode CE and adjacent to the first pattern layer SP1 and a third opening O3 adjacent to the second pattern layer SP2. An edge portion of the pixel defining layer 190 disposed on the separation pattern layer SP and defining a portion of the second opening O2 and a portion of the third opening O3 may have a portion protruding laterally (or horizontally) from the separation pattern layer SP. Protrusion portions 191 and 192 of the pixel defining layer 190 may be spaced apart from the second planarization layer 182 by at least a thickness of the separation pattern layer SP in a third direction z. A spacer 195 may be disposed on the pixel defining layer 190. The pixel defining layer 190 and the spacer 195 may include an organic insulating material such as a general purpose polymer such as poly(methyl methacrylate) or styrene, a polymer derivative having a phenolic group, an acrylic polymer, an imide-based polymer, and a siloxane-based polymer. The pixel defining layer 190 and the spacer 195 may be formed of a same material in a same process. The spacer 195 may be integral with the pixel defining layer 190, but may also be formed separately in a separate process.

An intermediate layer EL may be disposed on the first electrode E1, the pixel defining layer 190, and the spacer 195. The intermediate layer EL may include an emission layer EML and a functional layer FL.

The emission layer EML may be a layer in which electro-optical conversion occurs through a combination of electrons and holes, and may include an organic material and/or an inorganic material that emits light of a certain color. The emission layer EML may be disposed in the first opening O1 of the pixel defining layer 190, and may overlap the first electrode E1. A portion of the emission layer EML may be disposed on the pixel defining layer 190.

The functional layer FL may include at least one of a hole injection layer HIL, a hole transport layer HTL, an electron transport layer ETL, and an electron injection layer EIL. The functional layer FL may be divided into a first functional layer FL1 disposed between the first electrode E1 and the emission layer EML and a second functional layer FL2 disposed between the emission layer EML and the second electrode E2. The first functional layer FL1 may include a hole injection layer HIL and/or a hole transport layer HTL. The second functional layer FL2 may include an electron transport layer ETL and/or an electron injection layer EIL. The functional layer FL may be disposed over the entire display area DA. The functional layer FL may be disposed not only within the first opening O1 of the pixel defining layer 190 but also outside the first opening O1. The functional layer FL may be disconnected in the second opening O2 and the third opening O3 of the pixel defining layer 190 due to the protrusion portions 191 and 192 of the pixel defining layer 190. The protrusion portions 191 and 192 of the pixel defining layer 190 may be spaced apart from a lower layer thereof (e.g., the second planarization layer 182) by at least the thickness of the separation pattern layer SP. Thus, in the functional layer FL, portions disposed in the second and third openings O2 and O3 of the pixel defining layer 190 and portions disposed on the protrusion portions 191 and 192 of the pixel defining layer 190 may be separated.

The second electrode E2 may be disposed on the functional layer FL. The second electrode E2 may form the light emitting element LE such as an organic light emitting diode or an inorganic light emitting diode together with the first electrode E1 and the intermediate layer EL. The first electrode E1 may be an anode of the light emitting element LE, and the second electrode E2 may be a cathode of the light emitting element LE. Like the functional layer FL, the second electrode E2 may be disposed over the entire display area DA. The second electrode E2 may be positioned not only within the first opening O1 of the pixel defining layer 190 but also outside the first opening O1. The second electrode E2 may be disconnected in the second opening O2 and the third opening O3 of the pixel defining layer 190 due to the protrusion portions 191 and 192 of the pixel defining layer 190. The protrusion portions 191 and 192 of the pixel defining layer 190 may be spaced apart from a lower layer thereof by at least the thickness of the separation pattern layer SP. Thus, in the second electrode E2, first portions E2-*a* disposed in the second and third openings O2 and O3 of the pixel defining layer 190 and second portions E2-*b* disposed on the protrusion portions 191 and 192 of the pixel defining layer 190 may be separated. Accordingly, the second electrode E2 may be separated from adjacent pixels PX without being electrically connected. The second electrode E2 may be connected to the connection electrode CE in the second opening O2 of the pixel defining layer 190. In the second opening O2, the second electrode E2 may cover the functional layer FL, and an edge portion of the second electrode E2 may contact the connection electrode CE. As a result, the second electrode E2 may be connected (e.g., electrically connected) to the second transistor electrode D1 of the first transistor T1 through the connection electrode CE and the extension wire EW. The second electrode E2 may be made of a low work function metal such as calcium (Ca), barium (Ba), magnesium (Mg), aluminum (Al), silver (Ag), or a metal alloy, as a thin layer to have light transmittance. The second electrode E2 may include a transparent conductive oxide such as an indium tin oxide (ITO) or an indium zinc oxide (IZO).

A capping layer may be disposed on the second electrode E2. The capping layer may improve optical efficiency by adjusting a refractive index. An encapsulation layer may be disposed on the capping layer. The encapsulation layer may encapsulate a light emitting element LE to prevent moisture or oxygen from penetrating (or permeating) from the outside. The encapsulation layer may be a thin film encapsulation layer including one or more inorganic layers and one or more organic layers. The encapsulation layer may be provided in the form of a substrate to be bonded to the substrate 110. A touch sensor layer may be disposed on the encapsulation layer, and an anti-reflection layer for reducing external light reflection may be disposed on the touch sensor layer.

Hereinafter, a method of manufacturing a light emitting display panel illustrated in FIG. 4 will be described.

FIG. 5 to FIG. 10 illustrate process cross-sectional views showing a manufacturing method of an emissive display device according to an embodiment.

Figure 5:
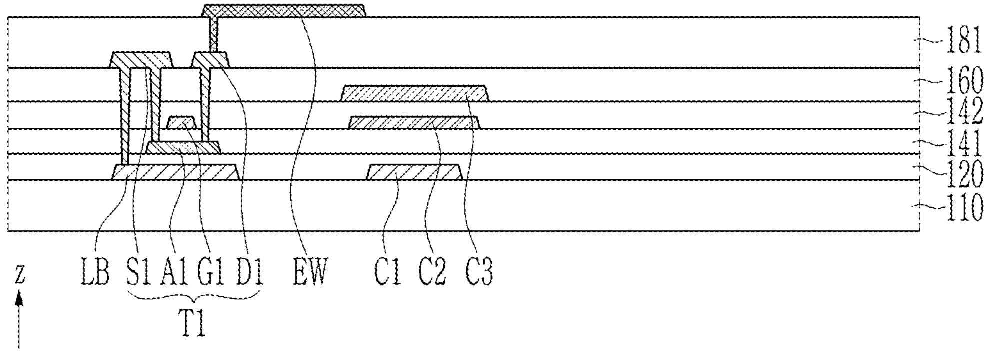
FIG. 5 to FIG. 10 illustrate process cross-sectional views showing a manufacturing method of an emissive display device according to an embodiment.

Referring to FIG. 5, a first conductive layer including the light blocking layer LB, the first capacitor electrode C1, and the like may be formed by forming a conductive material layer on the substrate 110 and then patterning the conductive material layer. The patterning of the conductive material layer may indicate forming a certain pattern layer by removing a portion of the layer through a photolithography process or the like. A buffer layer 120 may be formed on the first conductive layer. After a semiconductor material layer is formed on the buffer layer 120 and patterned, the semiconductor layer A1 may be formed. A first gate insulating layer 141 may be formed on the semiconductor layer A1. A second conductive layer including the gate electrode G1, the second capacitor electrode C2, and the like may be formed by forming a conductive material layer on the first gate insulating layer 141 and then patterning the conductive material layer. A second gate insulating layer 142 may be formed on the second conductive layer. A third conductive layer including the third capacitor electrode C3 and the like may be formed on the second gate insulating layer 142. An interlayer insulating layer 160 may be formed on the third conductive layer. A fourth conductive layer including the first transistor electrode S1, the second transistor electrode D1, and the like may be formed by forming a conductive material layer on the interlayer insulating layer 160 and then patterning the conductive material layer. A first planarization layer 181 may be formed on the fourth conductive layer, and a contact hole overlapping the second transistor electrode D1 may be formed in the first planarization layer 181. A fifth conductive layer including the extension wire EW and the like may be formed by forming a conductive material layer on the first planarization layer 181 and then patterning the conductive material layer. The extension wire EW may be connected to the second transistor electrode D1 through a contact hole formed in the first planarization layer 181.

Figure 6:
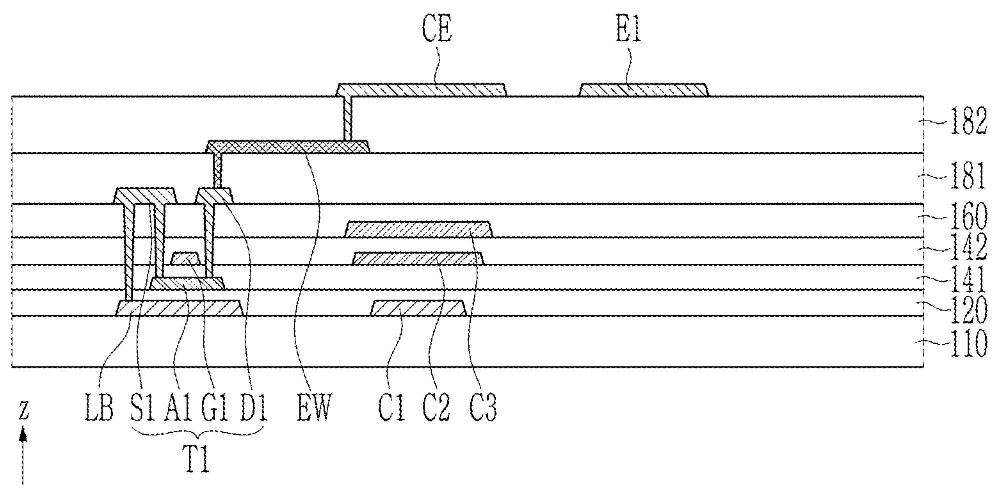

Referring to FIG. 6, a second planarization layer 182 may be formed on the fifth conductive layer, and a contact hole overlapping the extension wire EW may be formed in the second planarization layer 182. The connection electrode CE and the first electrode E1 may be formed by forming a conductive material layer on the second planarization layer 182 and then patterning the conductive material layer. The connection electrode CE may be connected to the extension wire EW through a contact hole formed in the second planarization layer 182.

Figure 7:
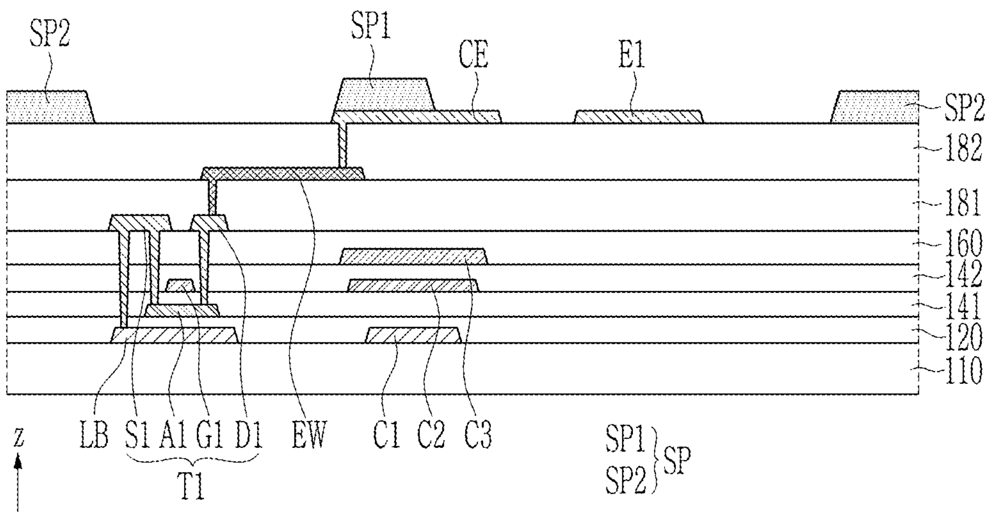

Referring to FIG. 7, a separation pattern layer SP may be formed by forming a conductive material layer or an insulating layer on the second planarization layer 182 and then patterning the conductive material layer or the insulating layer. The separation pattern layer SP may include a first pattern layer SP1 disposed on the connection electrode CE and a second pattern layer SP2 disposed to surround the light emitting element LE. To prevent damage to the sixth conductive layer during an etching process to form the separation pattern layer SP, the separation pattern layer SP may be formed of a material that is etched by using the sixth conductive layer and an etchant having high selectivity, e.g., may include an oxide semiconductor. The oxide semiconductor may include a combination of an oxide of a metal such as zinc (Zn), indium (In), gallium (Ga), tin (Sn), titanium (Ti), or a metal such as zinc (Zn), indium (In), gallium (Ga), tin (Sn), titanium (Ti), or an oxide thereof, and the oxide semiconductor may include at least one of an indium-zinc oxide (IZO), an indium-gallium-zinc oxide (IGZO), an indium-zinc-tin oxide (IZTO), an zinc-tin oxide (ZTO), or a zinc oxide (ZnO). For example, the separation pattern layer SP may be an oxide semiconductor including the indium-gallium-zinc oxide (IGZO) and/or the indium-zinc oxide (IZO). The oxide semiconductor may have characteristics of a conductor or an insulator according to an oxygen content.

Figure 8:
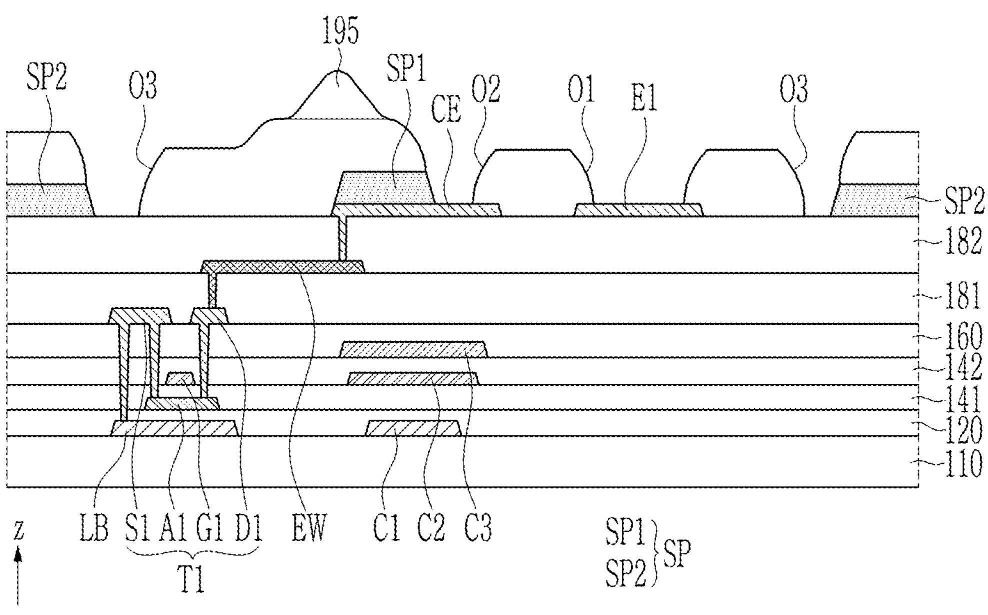

Referring to FIG. 8, a pixel defining layer 190 having a first opening O1, a second opening O2, and a third opening O3 may be formed by coating an organic material layer on the second planarization layer 182 and then patterning the organic material layer. In case that a halftone mask is used, the spacer 195 having a higher height than that of the pixel defining layer 190 may be simultaneously formed. The spacer 195 may be formed to contact a fine metal mask in order to prevent damage to a pre-formed structure by the fine metal mask used in case that the emission layer EML is deposited. The spacer 195 may have various planar shapes, such as a polygon, e.g., a triangle and a circle. An upper surface of the first electrode E1 may be exposed by the first opening O1, and a side surface of the separation pattern layer SP may be exposed by the second opening O2 and the third opening O3.

Figure 9:
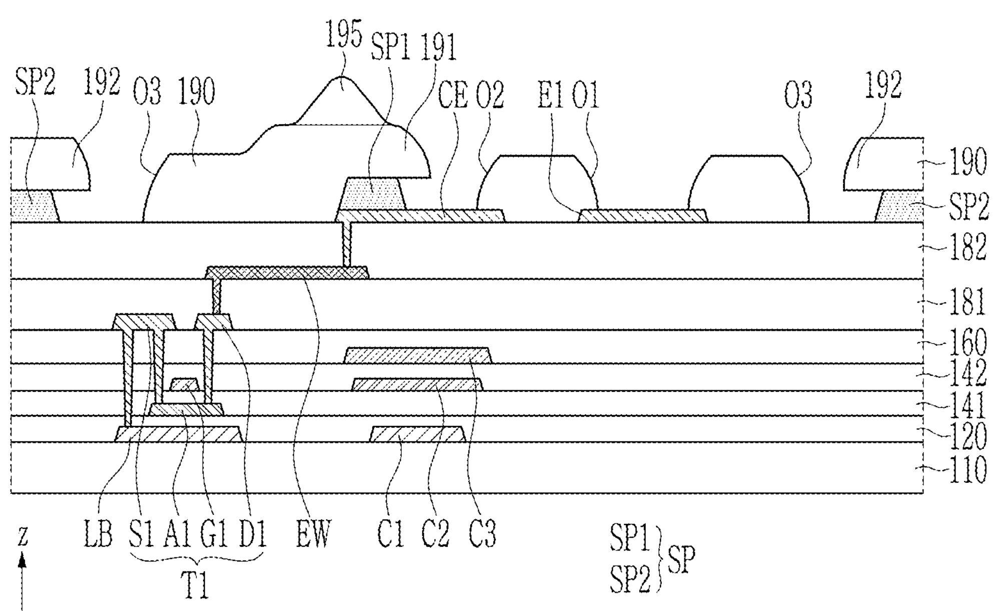

Referring to FIG. 9, a portion of the separation pattern layer SP may be removed by a wet etching process etching the separation pattern layer SP by using the pixel defining layer 190 as a mask. During the wet etching process, the exposed side surface (e.g., a side surface not covered by the pixel defining layer 190) of the separation pattern layer SP, may be removed in a skew shape or an undercut shape, and the separation pattern layer SP may have a narrow width. Accordingly, an edge portion of the pixel defining layer 190 disposed on the separation pattern layer SP may protrude laterally (or horizontally) from the separation pattern layer SP like eaves, and the pixel defining layer 190 may include the protrusion portions 191 and 192.

Figure 10:
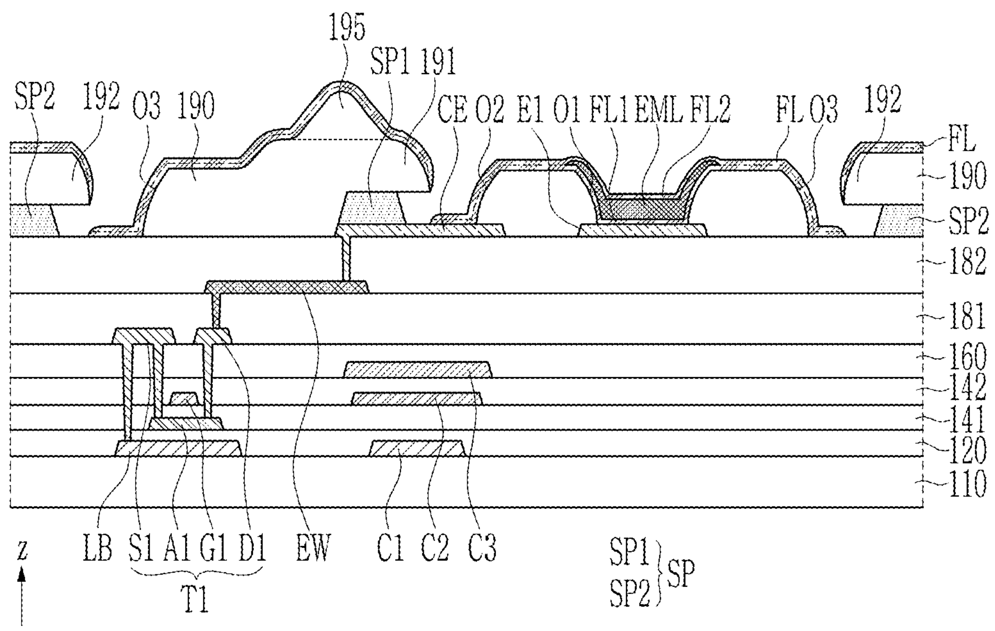

Referring to FIG. 10, the first functional layer FL1, the emission layer EML, and the second functional layer FL2 may be sequentially formed. The first functional layer FL1 and the second functional layer FL2 may be deposited (e.g., entirely deposited) by using an open mask. Accordingly, the first functional layer FL1 and the second functional layer FL2 may be formed over the entire display area DA. The emission layer EML may be formed in the first opening O1 by using a fine metal mask. The emission layer EML may be formed wider than the first opening O1 in consideration of a margin of a deposition process, and accordingly, a portion of the emission layer EML may be disposed on the pixel defining layer 190 beyond the first opening O1.

In the functional layer FL, portions disposed in the second and third openings O2 and O3 of the pixel defining layer 190 and portions disposed on the protrusion portions 191 and 192 of the pixel defining layer 190 may be separated by the protrusion portions 191 and 192 of the pixel defining layer 190. For example, in the connection electrode CE, a region between the first pattern layer SP1 and the functional layer FL may be exposed. The exposed region of the connection electrode CE may overlap the protrusion portion 191 of the pixel defining layer 190.

Referring to FIG. 4, the second electrode E2 may be formed by depositing a conductive material layer after forming the second functional layer FL2. The second electrode E2 may be deposited over an entire surface by using an open mask. Accordingly, the second electrode E2 may be formed over the entire display area DA. In the second electrode E2, first portions E2-*a* disposed in the second and third openings O2 and O3 of the pixel defining layer 190 and second portions E2-*b* disposed on the protrusion portions 191 and 192 of the pixel defining layer 190 may be separated by the protrusion portions 191 and 192 of the pixel defining layer 190. The separation pattern layer SP may be formed to be thicker than the connection electrode CE. Forming the separation pattern layer SP thickly may be advantageous to prevent a short circuit between the second electrode E2 disposed in the third opening O3 and the second electrode E2 disposed on the protrusion portion 192. The second electrode E2 may be deposited in the second opening O2 to cover an edge portion of the functional layer FL and contact the exposed region of the connection electrode CE. For example, in case that the functional layer FL is deposited by an evaporation method and the second electrode E2 is deposited by a sputtering method, the second electrode E2 may be deposited wider than the functional layer FL. As the second electrode E2 is separated by the protrusion portions 191 and 192 and contacts the connection electrode CE, the second electrode E2 may be connected (e.g., electrically connected) to the second transistor electrode D1 of the first transistor T1 of the corresponding pixel, and may be electrically separated from the pixel adjacent thereto.

Figure 11:
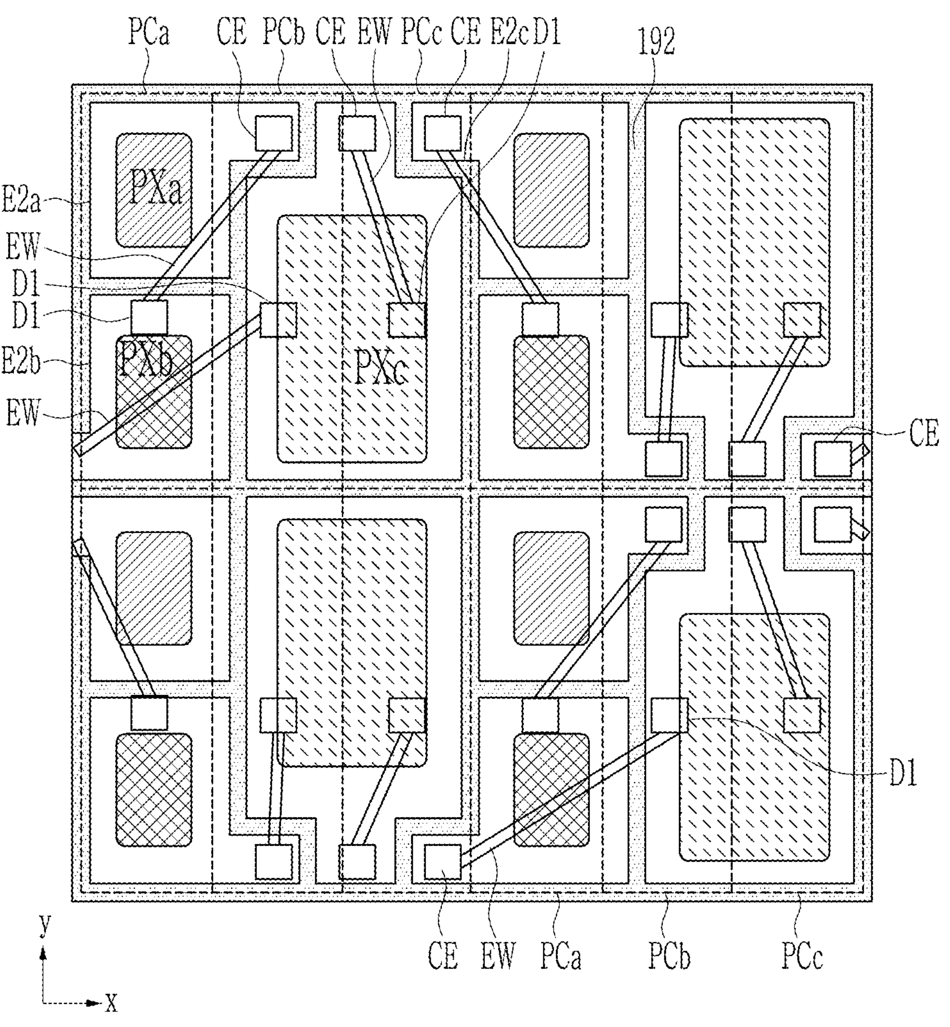
FIG. 11, FIG. 12, and FIG. 13 each illustrate a schematic top plan view showing pixels disposed in a display area in an emissive display device according to an embodiment.
Figure 12:
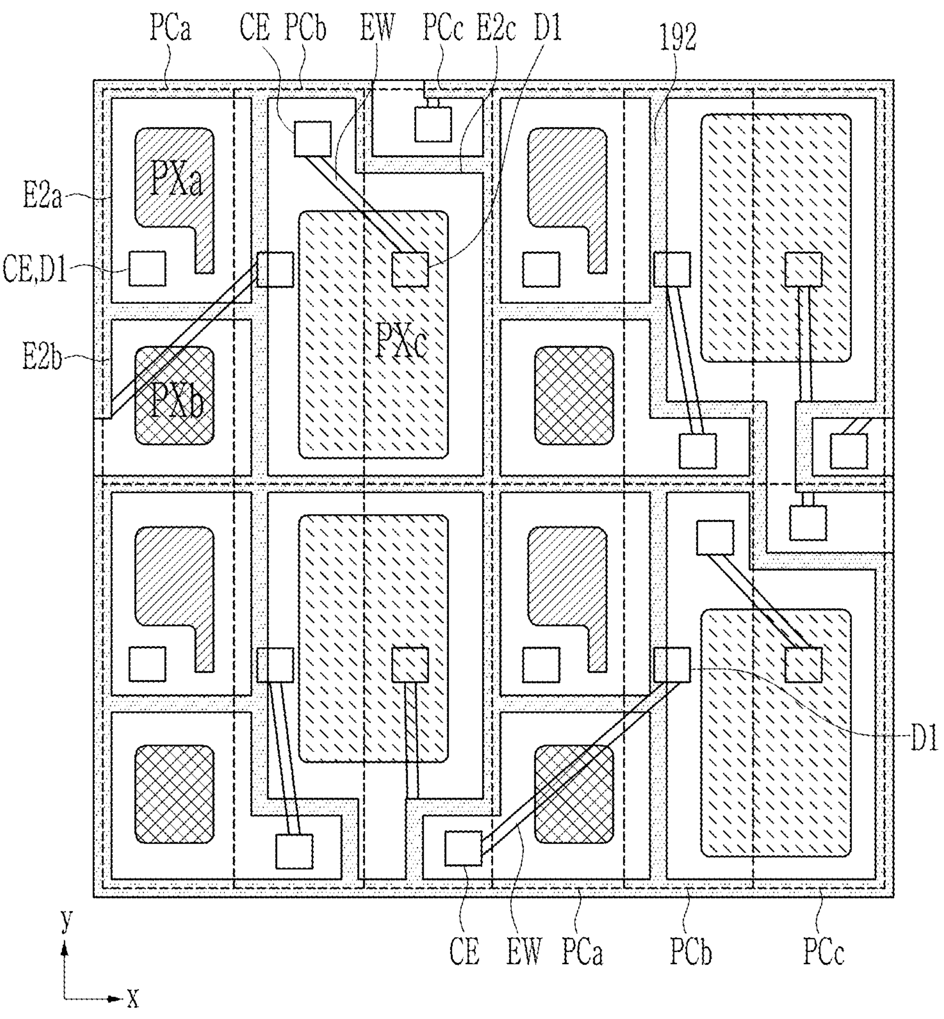
Figure 13:
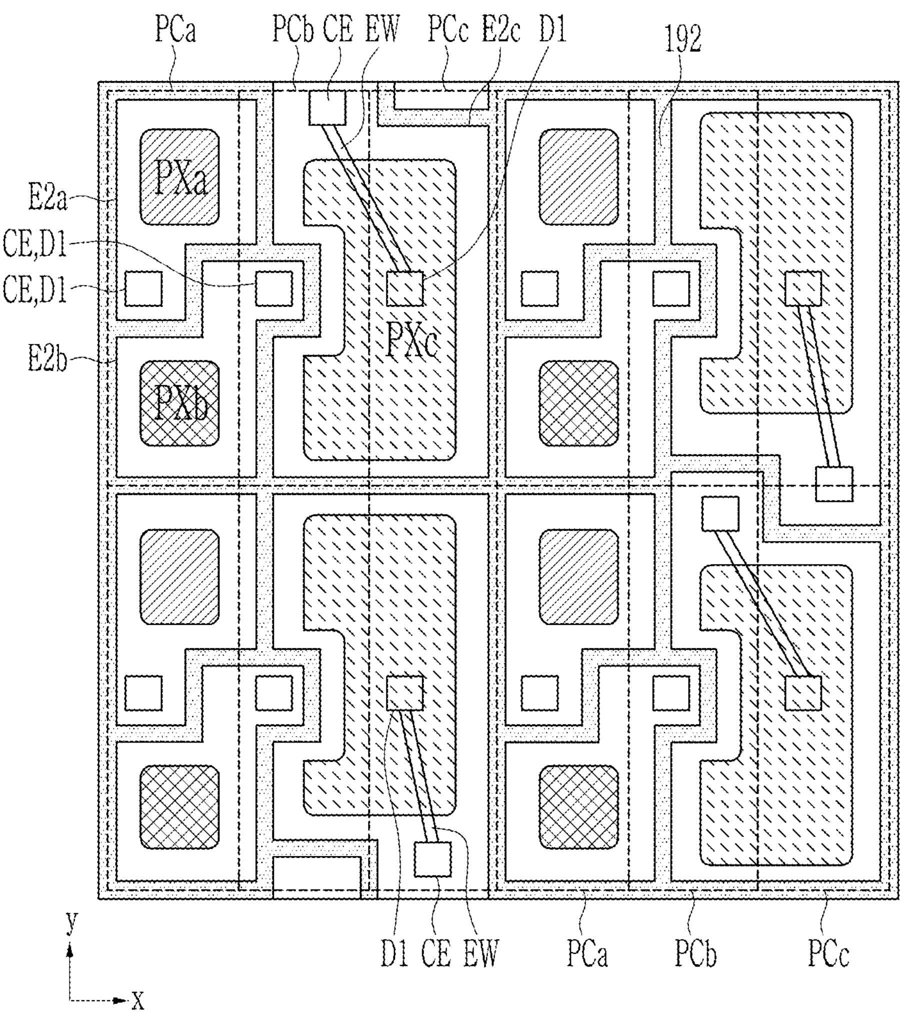

FIG. 11, FIG. 12, and FIG. 13 each illustrate a schematic top plan view showing pixels disposed in a display area in an emissive display device according to an embodiment.

Referring to FIG. 11, pixels PXa, PXb, and PXc disposed in the display area DA of the display panel 10 are illustrated. Each of the pixels PXa, PXb, and PXc illustrated as a rectangle may correspond to an emission area (e.g., an area in which the first opening O1 illustrated in FIG. 4 is formed). The pixels PXa, PXb, and PXc may include a first pixel PXa, a second pixel PXb, and a third pixel PXc. Although twelves pixels are illustrated, the pixels PXa, PXb, and PXc may be regularly arranged in a matrix form in the display area DA. In the illustrated embodiment, the first pixel PXa and the second pixel PXb may be alternately disposed in a second direction y in odd-numbered columns, and third pixels PXc may be disposed in even-numbered columns. A disposal of the pixels PXa, PXb, and PXc may be variously changed.

The first pixel PXa, the second pixel PXb, and the third pixel PXc may display lights of different colors, and each may display light of one of primary colors. For example, one of the first pixel PXa, the second pixel PXb, and the third pixel PXc may display red light, another may display green light, and the other may display blue light. For example, the first pixel PXa may display red light, the second pixel PXb may display green light, and the third pixel PXc may display blue light. An area of the third pixel PXc may be wider than an area of the first pixel PXa and an area of the second pixel PXb.

The first pixel PXa, the second pixel PXb, and the third pixel PXc may include first electrodes and second electrodes E2*a*, E2*b*, and E2*c*, respectively. As described above, the second electrodes E2*a*, E2*b*, and E2*c* may be disconnected (or separated) from each other between the pixels PXa, PXb, and PXc adjacent to each other by the protrusion portion 192 of the pixel defining layer 190.

Each of the pixels PXa, PXb, and PXc may include a light emitting element and pixel circuit units PCa, PCb, and PCc connected the light emitting element. A rectangular area indicated by a dotted line in the drawing may be an area of the pixel circuit units PCa, PCb, and PCc. The area in which the pixel circuit units PCa, PCb, and PCc are disposed may not be the same as the emission area of each of the pixels PXa, PXb, and PXc. For example, the first pixel circuit unit PCa of the first pixel PXa, the second pixel circuit unit PCb of the second pixel PXb, and the third pixel circuit unit PCc of the third pixel PXc may be alternately disposed along a first direction x. As described above, the light emitting area and the area of the pixel circuit units PCa, PCb, and PCc are not the same, and thus in case that a position of the connection electrode CE for contacting the second electrode E2 is not changed, the emission area may be reduced due to inefficient spatial arrangement. As illustrated, the emission area may be increased by disposing the connection electrode CE of each of the pixels PXa, PXb, and PXc between emission areas of the third pixels PXc adjacent in the second direction y and connecting to the second transistor electrode D1 of the first transistor T1 through the extension wire EW. For example, a sufficient contact area between the second electrode E2 and the connection electrode CE may be secured.

The extension wire EW may be applied only to some of the pixels PXa, PXb, and PXc. For example, referring to FIG. 12, the connection electrode CE of the second pixel PXb and the third pixel PXc may be connected to the second transistor electrode D1 of the first transistor T1 through the extension wire EW. The connection electrode CE of the first pixel PXa may be directly connected to the second transistor electrode D1 of the first transistor T1 or through another connection member without passing through the extension wire EW. Referring to FIG. 13, the connection electrode CE of the third pixel PXc may be connected to the second transistor electrode D1 of the first transistor T1 through the extension wire EW. The connection electrode CE of the first pixel PXa and the second pixel PXb may be connected to the second transistor electrode D1 of the first transistor T1 without passing through the extension wire EW.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. An emissive display device comprising:

a substrate;

a transistor disposed on the substrate;

an insulating layer disposed on the transistor;

a connection electrode disposed on the insulating layer and electrically connected to the transistor;

a first electrode of a light emitting element disposed on the insulating layer;

a separation pattern layer including a first pattern layer disposed on the connection electrode and a second pattern layer disposed on the insulating layer;

a pixel defining layer disposed on the insulating layer and the separation pattern layer, the pixel defining layer including an opening overlapping the connection electrode; and a second electrode of the light emitting element disposed on the pixel defining layer and connected to the connection electrode through the opening of the pixel defining layer.

2. The emissive display device of claim 1, wherein the pixel defining layer includes a protrusion portion protruding laterally from the separation pattern layer and defining a portion of the opening of the pixel defining layer.

3. The emissive display device of claim 2, wherein the protrusion portion is spaced apart from the insulating layer by at least a thickness of the separation pattern layer.

4. The emissive display device of claim 2, wherein a first portion of the second electrode disposed in the opening of the pixel defining layer and a second portion of the second electrode disposed on the protrusion portion are separated from each other.

5. The emissive display device of claim 4, further comprising:

a functional layer disposed between the first electrode and the second electrode, wherein the second electrode is in contact with the connection electrode and covers an edge portion of the functional layer in the opening of the pixel defining layer.

6. The emissive display device of claim 1, wherein the second electrode includes a plurality of second electrodes in a plurality of pixels, and the plurality of second electrodes are separated from each other.

7. The emissive display device of claim 1, wherein the separation pattern layer includes an oxide semiconductor.

8. The emissive display device of claim 1, wherein the first electrode is an anode of the light emitting element, and the second electrode is a cathode of the light emitting element.

9. The emissive display device of claim 8, wherein a high potential power voltage is applied to the first electrode.

10. The emissive display device of claim 1, wherein the connection electrode and the first electrode are formed of a same material in a same process.

11. The emissive display device of claim 1, wherein the transistor is an n-type transistor, and the connection electrode is electrically connected to a drain electrode of the transistor.

12. The emissive display device of claim 1, further comprising:

an extension wire disposed between the transistor and the insulating layer and electrically connected to the transistor and the connection electrode.

13. The emissive display device of claim 12, wherein the connection electrode is connected to the extension wire through a contact hole formed in the insulating layer.

14. The emissive display device of claim 12, wherein the connection electrode does not overlap the transistor.

15. The emissive display device of claim 1, wherein the connection electrode is disposed between emission areas of adjacent pixels.

16. The emissive display device of claim 15, wherein the adjacent pixels display a same color light.

* * * * *